(12) United States Patent
Kanungo et al.

(10) Patent No.: US 10,604,594 B2
(45) Date of Patent: Mar. 31, 2020

(54) IN-SITU EVALUATION OF CURING OF INK COMPOSITIONS VIA ABSORBANCE SPECTROSCOPY

(71) Applicant: XEROX CORPORATION, Norwalk, CT (US)

(72) Inventors: Mandakini Kanungo, Penfield, NY (US); Jack T. LeStrange, Macedon, NY (US); Peter Knausdorf, Henrietta, NY (US); Xin Yang, Webster, NY (US); Anthony S. Condello, Webster, NY (US)

(73) Assignee: XEROX CORPORATION, Norwalk, CT (US)

(*) Notice: Subject to any disclaimer, the term of this patent is extended or adjusted under 35 U.S.C. 154(b) by 0 days.

(21) Appl. No.: 16/459,802

(22) Filed: Jul. 2, 2019

(65) Prior Publication Data

US 2019/0322772 A1    Oct. 24, 2019

Related U.S. Application Data

(62) Division of application No. 15/662,573, filed on Jul. 28, 2017, now Pat. No. 10,385,144.

(51) Int. Cl.
| | |
|---|---|
| *B41J 11/00* | (2006.01) |
| *C08F 2/50* | (2006.01) |
| *G03F 7/031* | (2006.01) |
| *C09D 11/101* | (2014.01) |
| *B41M 7/00* | (2006.01) |
| *C09D 11/322* | (2014.01) |
| *G03F 7/029* | (2006.01) |

(52) U.S. Cl.
CPC ............... *C08F 2/50* (2013.01); *B41J 11/002* (2013.01); *B41M 7/0081* (2013.01); *C09D 11/101* (2013.01); *C09D 11/322* (2013.01); *G03F 7/029* (2013.01); *G03F 7/031* (2013.01)

(58) Field of Classification Search
CPC ......... B41J 2/2114; B41J 11/00; B41J 11/002; B41J 11/0015; C08F 2/50; G03F 7/031; C09D 11/101
See application file for complete search history.

(56) References Cited

U.S. PATENT DOCUMENTS

2014/0292924 A1* 10/2014 Ichihara ............... B41J 2/16508
                                                            347/37

* cited by examiner

*Primary Examiner* — Kristal Feggins
(74) *Attorney, Agent, or Firm* — Bell & Manning, LLC

(57) ABSTRACT

A method for evaluating curing in an ink composition comprises depositing an ink composition on the surface of an object via a direct-to-object inkjet printing system to form a film thereon, the ink composition comprising a photoinitiator capable of initiating a free radical polymerization process in the ink composition upon the absorption of light to cure the deposited film; exposing, in-situ, the deposited film to light generated by a first source of light under conditions which initiate the free radical polymerization process to cure the deposited film; exposing, in-situ, the cured film to light generated by a second source of light under conditions which induce light absorption by unreacted photoinitiator in the cured film; measuring the absorbance of the cured film; and determining a degree of cure in the cured film from the measured absorbance and predetermined calibration data.

14 Claims, 4 Drawing Sheets

IN-SITU EVALUATION OF CURING OF INK COMPOSITIONS VIA ABSORBANCE SPECTROSCOPY

CROSS-REFERENCE TO RELATED APPLICATIONS

The present application is a divisional of U.S. patent application Ser. No. 15/662,573, filed Jul. 28, 2017, the entire contents of which are incorporated herein by reference.

BACKGROUND

A variety of techniques have been used to evaluate the degree of cure in ink compositions. Such techniques include applying a solvent wipe to the surface of a cured film formed after depositing the ink composition. Visual inspection of the solvent wipe for removed material provides a qualitative measure of the degree of cure. Fourier-Transform Infrared Spectroscopy (FTIR) is another technique which may be used to quantitatively evaluate the degree of cure in the surface of the cured film via chemical fingerprints associated with the components of the uncured ink composition (e.g., carbon-carbon double bonds in unreacted monomers). Solvent extraction is another technique which may be used to quantitatively evaluate the degree of cure in the cured film. In this technique, the cured film is exposed to a solvent and the amount of material dissolved in the solvent measured and compared to that obtained from a fully cured film. Gas Chromatography/Mass Spectrometry (GC/MS) may be added to identify the dissolved material (e.g., unreacted monomers).

SUMMARY

The present disclosure, which enables a quantitative, efficient measurement of the degree of cure of an ink composition without having to handle or destroy the cured film, accordingly provides illustrative examples of methods and systems for evaluating, in-situ, the degree of cure of ink compositions.

In one aspect, methods for evaluating curing in an ink composition are provided. In embodiments, the method comprises depositing an ink composition on the surface of an object via a direct-to-object inkjet printing system to form a film thereon, the ink composition comprising a photoinitiator capable of initiating a free radical polymerization process in the ink composition upon the absorption of light to cure the deposited film; exposing, in-situ, the deposited film to light generated by a first source of light under conditions which initiate the free radical polymerization process to cure the deposited film; exposing, in-situ, the cured film to light generated by a second source of light under conditions which induce light absorption by unreacted photoinitiator in the cured film; measuring the absorbance of the cured film; and determining a degree of cure in the cured film from the measured absorbance and predetermined calibration data.

In another aspect, direct-to-object printing systems are provided. In embodiments, the system comprises an array of printheads, the array comprising one printhead configured to eject an ink composition and one or more additional printheads configured to eject one or more additional ink compositions; a support member positioned parallel to the array of printheads; an object holder configured to hold an object such that the surface of the object faces towards the array of printheads, the object holder moveably mounted to the support member; a first source of light; a second source of light; an actuator operatively connected to the object holder to move the object holder relative to the array of printheads, the first source of light, and second source of light; and a controller operatively connected to the array of printheads, the actuator, the first source of light, and the second source of light. The controller is configured to operate the direct-to-object printing system to deposit the ink composition on the surface of the object to form a film thereon, the ink composition comprising a photoinitiator capable of initiating a free radical polymerization process in the ink composition upon the absorption of light to cure the deposited film; expose, in-situ, the deposited film to light generated by the first source of light under conditions which initiate the free radical polymerization process to cure the deposited film; expose, in-situ, the cured film to light generated by the second source of light under conditions which induce light absorption by unreacted photoinitiator in the cured film; measure the absorbance of the cured film; and determine a degree of cure in the cured film from the measured absorbance and predetermined calibration data.

BRIEF DESCRIPTION OF THE DRAWINGS

Illustrative embodiments will hereafter be described with reference to the accompanying drawings.

DETAILED DESCRIPTION

Figure 1A:
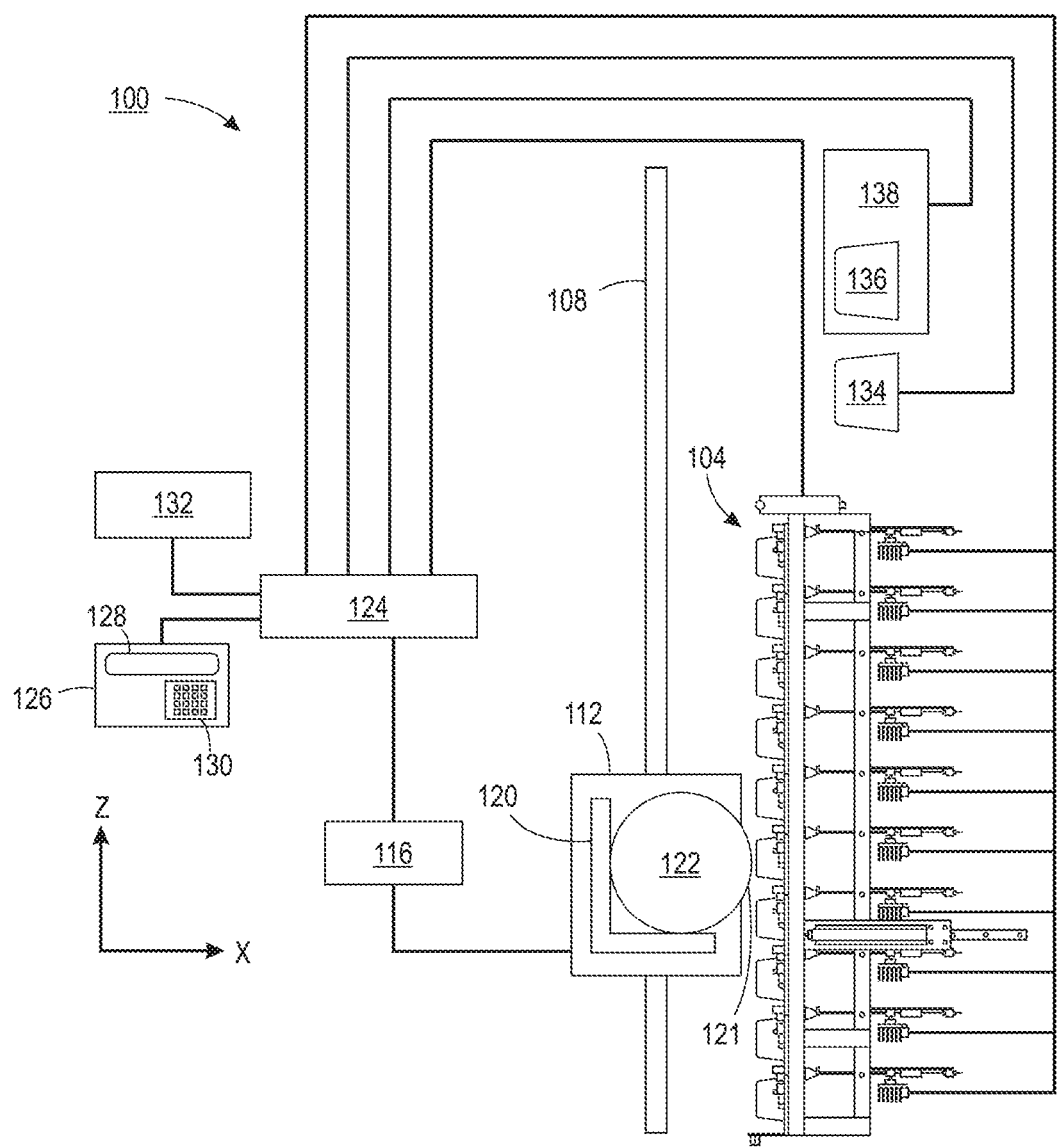
FIG. 1A depicts a schematic of a direct-to-object inkjet printing system that may be used to carry out the present methods according to an illustrative embodiment.

The present disclosure provides methods and systems for evaluating, in-situ, the degree of cure in ink compositions. In embodiments, the methods are faster and less complex than conventional techniques such as FTIR and solvent extraction. Moreover, the methods are non-destructive and minimize contact of cured films until the desired degree of cure is obtained. Finally, despite providing an indirect measurement of the degree of cure, the methods are both quantitative and accurate.

A method for evaluating curing in an ink composition includes depositing an ink composition on a surface of an object via a direct-to-object inkjet printing system to form a film thereon. The ink composition comprises a photoinitiator capable of initiating a free radical polymerization process in the ink composition upon the absorption of light to cure the deposited film. The method further comprises exposing, in-situ, the deposited film to a first source of light under conditions which initiate the free radical polymerization process to cure the deposited film. The method further comprises exposing, in-situ, the cured film to a second source of light under conditions which induce light absorption by unreacted photoinitiator. The method further comprises measuring the absorbance and determining a degree of cure in the cured film from the measured absorbance and predetermined calibration data.

In the present disclosure, "in-situ" means that the referenced step is accomplished without removing the object from the direct-to-object inject printing system.

The method may be used to evaluate curing in a variety of ink compositions. In embodiments, the ink compositions comprise various combinations of acrylate oligomers and acrylate monomers. Illustrative acrylate oligomers include epoxy acrylates, aliphatic urethane acrylates, aromatic urethane acrylates, polyester acrylates, acrylic acrylates, etc. Acrylate monomers may be monofunctional or multifunctional (e.g., bifunctional, trifunctional, etc.). Illustrative acrylate monomers include isobornylacrylate, tripropylene glycol diacrylate, trimethylol propane triacrylate, hexanedioldiacrylate, di-trimethylolpropanetetra-acrylate, etc. In the present disclosure, the term "acrylate" also encompasses methacrylate. The ink compositions may also include various additives such as pigments (to impart color), fillers, defoamers, surface modifiers, etc. Additives also include dispersant and wetting additives such as silicone containing additives and polyacrylate based additives, rheological additives such as organoclay, diamide and polyester. Illustrative defoamers include modified polyols, polysiloxanes and dispersion of olefinic solids. The selection of these components and their relative amounts depends upon the desired properties for the cured film. One or more different ink compositions may be deposited in the methods in order to form the film on the object referenced above, e.g., individual ink compositions may form portions of the film which together form a complete film.

As noted above, the ink compositions also include a photoinitiator. The photoinitiator absorbs certain wavelengths of light to generate free radicals which react with components of the ink composition (e.g., the unsaturated double bonds in oligomers and monomers such as acrylate groups), as part of a free radical polymerization process to polymerize and crosslink, i.e., cure, the ink composition. Various types of photoinitiators and amounts may be used depending upon the desired properties for the cured film. Photoinitiators which generate free radicals by different processes may be used, e.g., Type I and Type II photoinitiators. Combinations of different types of photoinitiators may be used. Illustrative photoinitiators include methyl 2-benzyl benzonate, diphenyl(2,4,6-trimethylbenzoyl)phosphine oxide (TPO), 1-Hydroxycyclohexyl-1-phenyl methanone and 1-Butanone, 2-(dimethylamino)-2-(4-methylphenyl)methyl-1-4-(4-morpholinyl)phenyl-. Commercially available photoinitiators such as Irgacure 184 and Irgacure 379 may be used. The ink compositions may include more than one type of photoinitiator, e.g., two.

As noted above, the methods may be carried out on a direct-to-object inkjet printing system. The direct-to-object inkjet printing system is configured to apply image content (e.g., pictures, words, numbers, etc.) to the surfaces of a variety of objects. Illustrative objects include commercial articles such as sports equipment (e.g., football helmets, golf clubs, soccer balls, etc.), clothing (e.g., hats, T-shirts, jackets, etc.), containers (e.g., travel mugs, water bottles, etc.), etc. Objects to be printed may be finished, post-manufactured products, i.e., as opposed to the raw materials used to manufacture the objects. The direct-to-object inkjet printing system may be used to apply image content to objects in a non-production environment (e.g., a distribution site) for customizing the objects prior to sale or distribution.

A schematic of an illustrative direct-to-object inkjet printing system 100 which may be used to carry out the present methods is shown in FIG. 1A. The printing system 100 includes a vertically oriented array of printheads 104, a support member 108, a member 112 movably mounted to the support member 108, an actuator 116 operatively connected to the movably mounted member 112, an object holder 120 configured to mount to the movably mounted member 112 and to hold an object 122, and a controller 124 operatively connected to the array of printheads 104 and the actuator 116. As shown in FIG. 1A, the array of printheads 104 is a 10×1 linear array (i.e., 10 printheads), although other array configurations can be used. Each printhead is fluidly connected to a supply of an ink composition (not shown) and is configured to eject the ink composition onto a surface 121 of the object 122. Some of the printheads can be connected to the same supply or each printhead can be connected to its own supply so each printhead can eject a different ink composition.

The support member 108 is positioned parallel to a line (or plane) formed by the array of printheads 104 (i.e., parallel to the z-axis or parallel to the yz plane, the y axis projects out of the plane of the paper of FIG. 1A). The member 112 is movably mounted to the support member 108 to enable the member 112 to slide along the support member 108. In some embodiments, the member 112 can move bi-directionally along the support member 108 (i.e., in the +z direction and the −z direction). The actuator 116 is operatively connected to the movably mounted member 112 so the actuator 116 can move the moveably mounted member 112 along the support member 108 and enable the object holder 120 mounted to the moveably mounted member 112 (as well as the object 122) to pass the array of printheads 104 in one dimension. In the embodiment depicted in FIG. 1A, the movably mounted member 112 moves the object 122 along the z axis while the array of printheads 104 remains stationary.

Figure 1B:
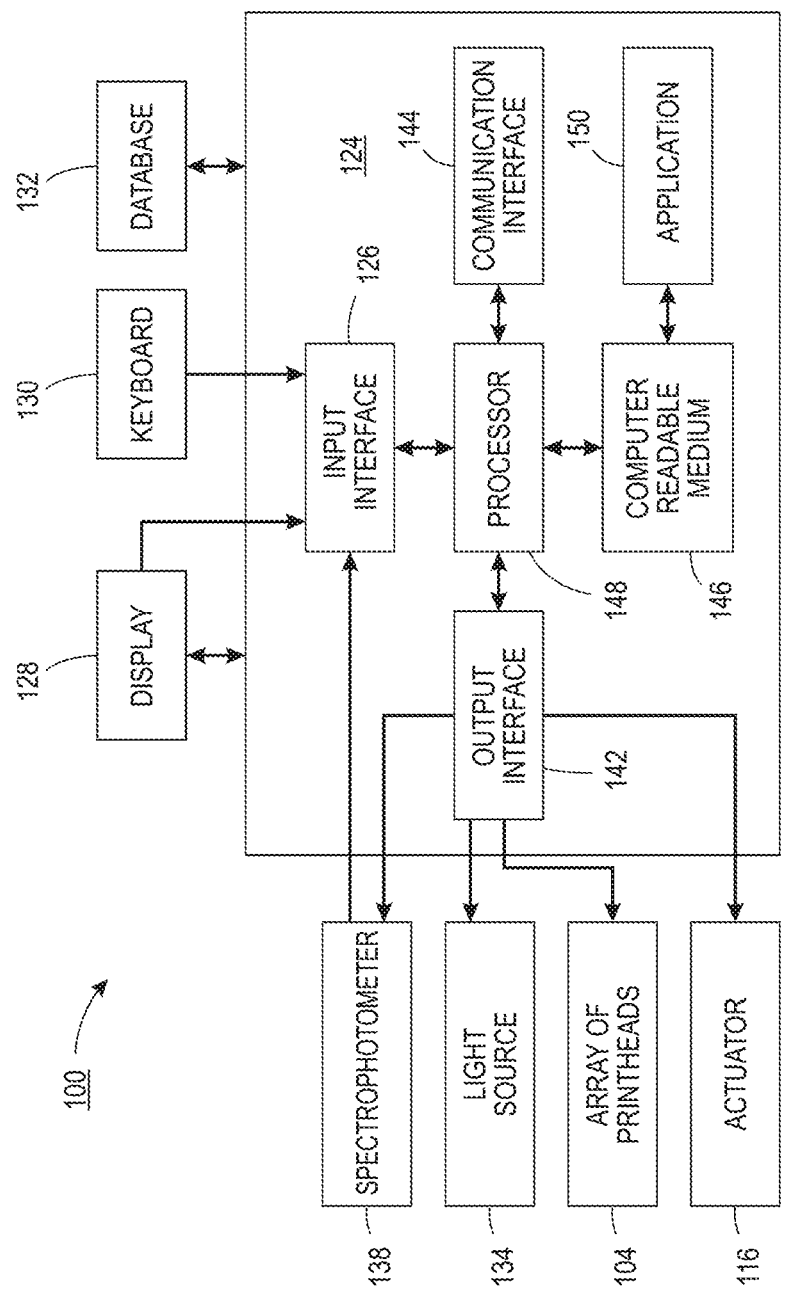
FIG. 1B depicts a schematic of an illustrative controller of the direct-to-object inject printing system of FIG. 1A.

The controller 124 controls the operation of various components of the printing system 100. As shown in FIG. 1B, the controller 124 may include various interfaces (e.g., input interface 126, output interface 142, communication interface 144, and combinations thereof), a computer-readable medium 146, a processor 148, and a control application 150. By way of illustration, the input interface 126 may interface with various input technologies such as a display 128, a keypad 130, etc. to allow a user to enter information into controller 124 or to make selections from options shown on the display 128.

The processor 148 of the controller 124 executes instructions, meaning that it performs/controls the operations called for by that instruction. The processor 148 may be implemented in hardware, firmware, or any combination of these methods and/or in combination with software. The processor 148 operably couples with input interface 126, with output interface 142, with computer-readable medium 146, and with communication interface 144 to receive, to send, and to process information.

Figure 1C:
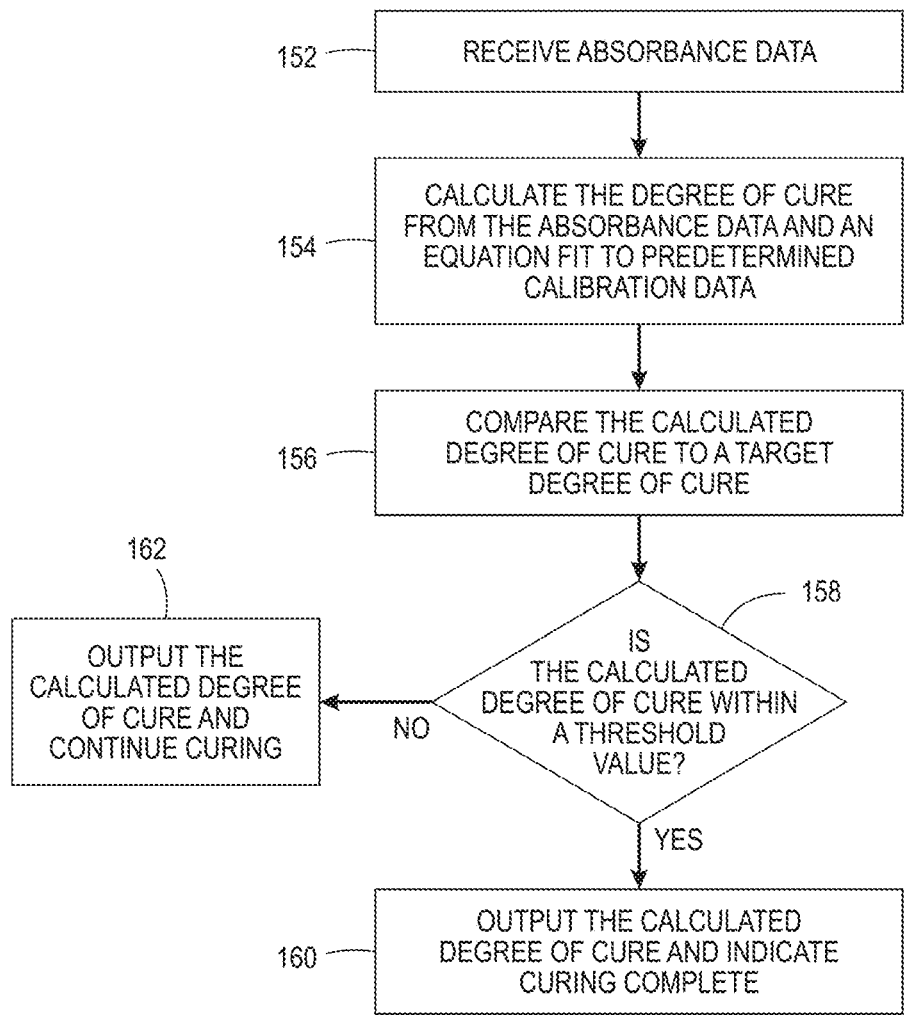
FIG. 1C depicts a flow diagram showing illustrative operations performed by the controller of FIG. 1B.

The control application 150 performs operations associated with controlling the operation of the printing system 100. The operations may be implemented using hardware, firmware, software, or any combination of these methods. The control application 150 may be implemented in software (comprised of computer-readable and/or computer-executable instructions) stored in the computer-readable medium 146 and accessible by the processor 148 for execution of the instructions that embody the operations of the control application 150. In this way, the controller 124 may be configured to operate the actuator 116 to move the object holder 120 (and the object 122 mounted thereon) past the array of printheads 104. The controller 124 may also be configured to operate the array of printheads 104 to eject the ink composition onto the surface 121 of the object 122 as the object holder 120 passes the array of printheads 104. Other illustrative operations which may be associated with control application 150 are shown in FIG. 1C, and are further described below.

Other details of the printing system 100 and other illustrative direct-to-object printing systems may be found in U.S. application Ser. No. 15/163,880, which is hereby incorporated by reference in its entirety.

The printing system 100 further includes a first light source 134, the operation of which may also be controlled by controller 124. The controller 124 may be configured to operate the actuator 116 to move the object holder 120 (and the object 122 mounted thereon) to a position in front of the first light source 134. Once in position (or while the object holder 120 is moving past the first light source 134), a film of deposited ink composition on the surface 121 of the object 122 can be exposed to light generated by the first light source 134 upon a signal from the controller 124.

The first light source 134 is configured to induce curing in the deposited film. This means that the deposited film is exposed to light from the first light source 134 under conditions which initiate the free radical polymerization process to cure the deposited film. These conditions can refer to the wavelength and intensity of the light generated by the first light source 134. Selection of the wavelength and intensity can depend in part, upon the components of the ink composition including the photoinitiator. Other considerations which may guide selection include the presence of pigments in the ink composition as well as the thickness of the deposited film (e.g., greater intensities may be used in the presence of pigments and/or with thicker films). In general, however, the wavelength and intensity are selected to initiate the free radical polymerization process in the deposited film as described above. Wavelength and intensity may also be adjusted to optimize curing. In embodiments, the wavelength is selected such that it substantially overlaps an absorption maximum ($\lambda_{max}$) of the photoinitiator. The term "substantially" means that the selected wavelength is within ±10% or less of the $\lambda_{max}$ of the photoinitiator. Similarly, for a particular first light source 134 having a predetermined wavelength and intensity, the photoinitiator may also be selected by following these same guidelines.

In embodiments, the light generated by the first light source 134 is in the ultraviolet (UV) to visible portion of the electromagnetic spectrum, i.e., comprises a wavelength in the range of from about 200 nm to about 450 nm. In embodiments, the light comprises a wavelength in the range of from about 340 nm to about 420 nm, from about 350 nm to about 410 nm, or from about 360 nm to about 405 nm. In embodiments, the light comprises a wavelength of about 395 nm. Various light sources may be used for the first light source 134. In embodiments, the light source is a light-emitting diode (LED). LED light sources are characterized by fairly narrow spectral widths, e.g., about 50 nm, about 100 nm, or about 150 nm.

The conditions sufficient to initiate the free radical polymerization process to cure the deposited film and to optimize curing can also include the length of time the deposited film is exposed to light generated by the first light source 134.

Curing may also be accomplished using two light sources instead of the single light source 134 shown in FIG. 1A. Two light sources may be useful for bulk and surface curing of the deposited film.

The printing system 100 further includes a second light source 136, the operation of which may also be controlled by the controller 124. The controller 124 may be configured to operate the actuator 116 to move the object holder 120 (and the object 122 mounted thereon) to a position in front of the second light source 136. Once in position (or while the object holder 120 is moving past the second light source 136), the cured film on the surface 121 of the object 122 can be exposed to light generated by the second light source 136 upon a signal from the controller 124.

The second light source 136 is configured to induce light absorption by unreacted photoinitiator which may be present in the cured film after a curing step, depending upon the degree of cure. This means that the cured film is exposed to light from the second light source 136 under conditions sufficient to induce such light absorption. These conditions can refer to the wavelength and intensity of the light generated by the second light source 136. Again, selection of the wavelength and intensity can depend, in part, upon the components of the ink composition. However, unlike the selection of the first light source 134 as described above, the wavelength and/or intensity of the light generated by second light source 136 may be selected to minimize or prevent generation of photoinitiator free radicals so as to minimize or prevent further curing by the second light source 136. This may be accomplished by decreasing the intensity of the light at the selected wavelength. The selected wavelength may be any of those described above with reference to the first source of light 134. Alternatively, or in addition, the length of time the cured film is exposed to the second light source 136 may be limited so as to minimize or prevent further curing. Various light sources may be used for the second light source 136. In embodiments, the light source is a lamp, e.g., a halogen or a xenon lamp. Such light sources are characterized by relatively broad spectral widths, e.g., greater than about 500 nm, greater than about 700 nm, or about 1000 nm. This is useful so that the intensity at the selected wavelength is reduced, thereby minimizing or preventing further curing as described above. In other embodiments, the light source is an LED light source, e.g., emitting light at about 365 nm or about 395 nm.

As shown in FIG. 1A, the second light source 136 may be part of a spectrophotometer 138 which may be operatively connected to the controller 124. The spectrophotometer 138 may include components typically found in spectrophotometers, e.g., monochromator, optics for directing light, detector, and/or a controller (i.e., distinct from controller 124). After the cured film is exposed to light from the second light source 136, the light reflected from the surface of the cured film is detected. The reflectance R is the ratio of the intensity of the reflected light (I) to the intensity of the light originally directed at the surface of the cured film ($I_0$). The absorbance A is thus A=−log R. The absorbance A is directly proportional to the amount of unreacted photoinitiator in the cured film via Beer's law. A decrease in absorbance A indicates a decrease in the amount of unreacted photoinitiator in the cured film. A decrease in the amount of unreacted photoinitiator is due to the generation of free radical species which participate in the reactions of the free radical polymerization process, leading to a cured film as described above. Thus, a decrease in absorbance A indicates an increase in the degree of cure, i.e., the degree of polymerization. The phrase "measuring absorbance" and the like can refer to determining an absorbance value from raw intensity data as described above. This determination may be carried out by a controller operatively connected to the spectrophotometer 138, including controller 124, e.g., via operations associated with control application 150.

Quantifying the degree of cure in a cured film having an unknown degree of cure is carried out by comparing the measured absorbance A to predetermined calibration data. The predetermined calibration data relates absorbance to a different, predetermined measurement of the degree of cure of a control ink composition. The different, predetermined measurement of degree of cure may be one derived from a conventional technique for measuring degree of cure, such as solvent extraction. Using solvent extraction, a cured film is exposed to a solvent and the amount of material dissolved in the solvent is measured. The dissolved material primarily includes unreacted components such as monomers. The amount of dissolved material measured can be compared to the amount of dissolved material measured from a control film which has been fully cured. This ratio (or percentage) is equivalent to the degree of cure.

Figure 2:
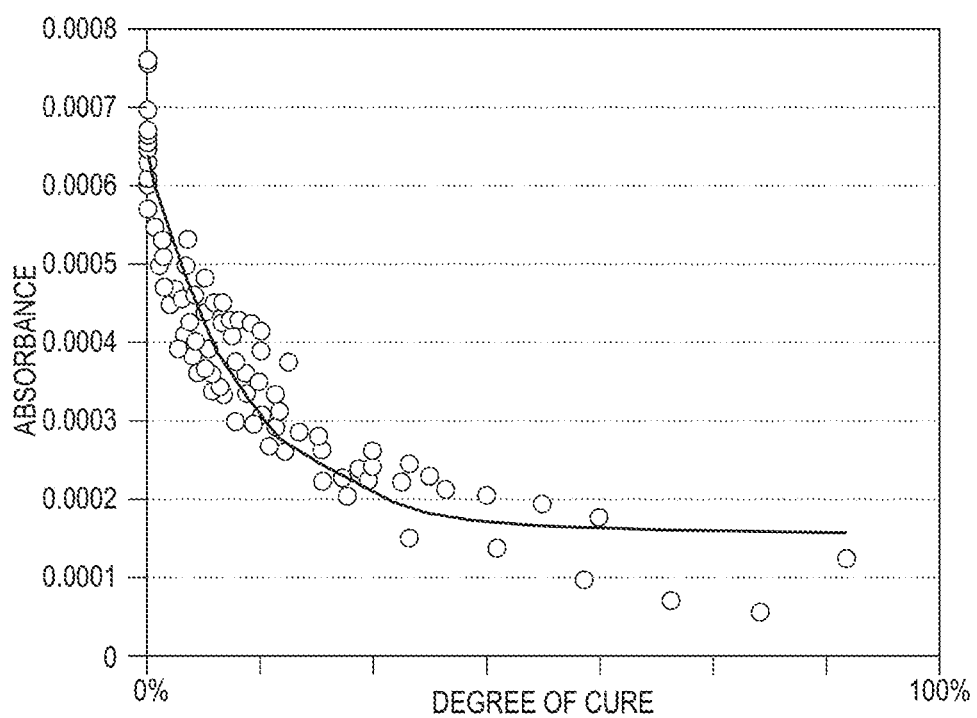
FIG. 2 is a plot of absorbance versus degree of cure.

To generate predetermined calibration data which relates absorbance to the degree of cure via solvent extraction, a series of films formed from a control ink composition, each film in the series having a different, but known degree of cure as measured using solvent extraction are prepared. Next, an absorbance measurement is made for each of these films as described above. The result is predetermined calibration data comprising a set of predetermined absorbance values and associated predetermined degree of cure values. FIG. 2 shows illustrative predetermined calibration data obtained as described above. The absorbance values are for the photoinitiator and the degree of cure values are those obtained using solvent extraction. The predetermined calibration data may also be plotted and a fit to an equation (see the best fit line to the data in FIG. 2). The equation can be used to calculate the degree of cure from the measured absorbance from a cured film having an unknown degree of cure. The control ink composition used to generate the predetermined calibration data may be an ink composition which is the same or substantially the same as used to prepare the cured film having the unknown degree of cure. The term "substantially" is used in recognition of the fact that the two ink compositions may not be identical but the differences do not result in material differences in the curing of the two ink compositions.

Determination of the degree of cure in a cured film having an unknown degree of cure may be carried out using a processor, e.g., the processor 148 of the controller 124. This includes fitting the predetermined calibration data to the equation, calculating the degree of cure from the measured absorbance and the equation, or both. The determination may be output to the display 126. The predetermined calibration data may be stored in a memory accessible by the processor 148 or a database 132 accessible by the processor 148.

Once the degree of cure is determined, a decision may be made as to whether an additional curing step using the first source of light 134 is desirable or not. Additional determinations of the degree of cure and additional curing may be carried out until a target degree of cure is obtained. A determination as to whether additional curing steps should be carried out may also be accomplished using the processor 148 of the controller 124. By way of illustration, the calculated degree of cure may be compared to a predetermined target degree of cure. If the calculated degree of cure is outside of a predetermined threshold value, e.g., outside ±10%, ±5%, ±2%, etc. of the predetermined degree of cure, then one or more additional curing steps may be carried out. In addition, one or more of the curing conditions may be adjusted in order to optimize curing. If the calculated degree of cure is within the predetermined threshold value, the curing may be considered to be complete.

Some of the operations which may be associated with control application 150 are illustrated in FIG. 1C. In an operation 152, absorbance data are received for processing by the processor 148. This data may include raw intensity data, e.g., from a detector of the spectrophotometer 138. Such raw intensity data may be subsequently processed by processor 148 to provide the absorbance A. Next, in operation 154, the degree of cure may be calculated from the absorbance data and an equation fit to predetermined calibration data. This predetermined calibration data may be read from the computer-readable medium 146 or the database 132. The fitting of the equation to the predetermined calibration data may also be carried out by the processor 148. Next, in operation 156, the calculated degree of cure can be compared with the target degree of cure, which may have been input by a user via the input interface 126. Next, in operation 158, a determination is made concerning whether or not the calculated degree of cure is within the predetermined threshold value. If the calculated degree of cure is within the predetermined threshold value, then in operation 160, the calculated degree of cure may be output, e.g., to the display 128, in the form of an indication that curing is complete. If the calculated degree of cure is outside the predetermined threshold value, then in operation 162, the calculated degree of cure may be output, e.g., via the output interface 142, in the form of a signal to the relevant components of the direct-to-object printing system 100 to continue curing (with or without adjusting one or more of the curing conditions).

The methods may be carried out on other types of inkjet printing systems, e.g., three-dimensional printing systems.

Also provided are systems for carrying out the methods. The illustrative printing system 100 of FIG. 1A is an example.

As throughout the present disclosure, the term "mount" and similar terms encompass direct mounting (in which the referenced elements are in direct contact) and indirect mounting (in which the referenced elements are not in direct contact, but are connected through an intermediate element). Elements referenced as mounted to each other herein may further be integrally formed together. As a result, elements described herein as being mounted to each other need not be discrete structural elements. The elements may be mounted permanently, removably, or releasably unless specified otherwise.

In addition, use of directional terms, such as top, bottom, right, left, front, back, upper, lower, etc. are merely intended to facilitate reference to various surfaces that form components of the devices referenced herein and are not intended to be limiting in any manner.

It will be appreciated that variants of the above-disclosed and other features and functions or alternatives thereof, may be combined into many other different systems or applications. Various presently unforeseen or unanticipated alternatives, modifications, variations or improvements therein may be subsequently made by those skilled in the art, which are also intended to be encompassed by the following claims.

What is claimed is:

1. A direct-to-object printing system comprising:
    an array of printheads, the array comprising one printhead configured to eject an ink composition and one or more additional printheads configured to eject one or more additional ink compositions;
    a support member positioned parallel to the array of printheads;
    an object holder configured to hold an object such that the surface of the object faces towards the array of printheads, the object holder moveably mounted to the support member;

a first source of light;
a second source of light;
an actuator operatively connected to the object holder to move the object holder relative to the array of printheads, the first source of light, and second source of light; and
a controller operatively connected to the array of printheads, the actuator, the first source of light, and the second source of light, the controller comprising a processor and a computer-readable medium operatively coupled to the processor, the computer-readable medium having computer-readable instructions stored thereon that, when executed by the processor, cause the direct-to-object printing system to
(a) deposit the ink composition on the surface of the object to form a film thereon, the ink composition comprising a photoinitiator capable of initiating a free radical polymerization process in the ink composition upon the absorption of light to cure the deposited film;
(b) expose, in-situ, the deposited film to light generated by the first source of light under conditions which initiate the free radical polymerization process to cure the deposited film;
(c) expose, in-situ, the cured film to light generated by the second source of light under conditions which induce light absorption by unreacted photoinitiator in the cured film;
(d) measure the absorbance of the cured film; and
(e) determine a degree of cure in the cured film from the measured absorbance and predetermined calibration data.

2. The system of claim 1, wherein the second light source is part of a spectrophotometer operatively connected to the controller.

3. The system of claim 1, wherein the first source of light is a light-emitting diode and the second source of light is a lamp.

4. The system of claim 1, the computer-readable medium further having computer-readable instructions stored thereon that, when executed by the processor, cause the controller to calculate the degree of cure using the measured absorbance and an equation fit to the predetermined calibration data.

5. The system of claim 4, the computer-readable medium further having computer-readable instructions stored thereon that, when executed by the processor, cause the controller to compare the calculated degree of cure to a predetermined target degree of cure and to carry out step (b) an additional time if the calculated degree of cure is outside a predetermined threshold value.

6. The system of claim 4, wherein the predetermined calibration data comprises a set of predetermined absorbance values and associated predetermined degree of cure values, the predetermined degree of cure values generated using solvent extraction.

7. A controller for a direct-to-object printing system, the controller comprising
a processor; and
a computer-readable medium operatively coupled to the processor, the computer-readable medium having computer-readable instructions stored thereon that, when executed by the processor, cause a direct-to-object printing system operatively coupled to the controller to
(a) deposit an ink composition on a surface of an object to form a film thereon, the ink composition comprising a photoinitiator capable of initiating a free radical polymerization process in the ink composition upon the absorption of light to cure the deposited film;
(b) expose, in-situ, the deposited film to light generated by a first source of light of the direct-to-object printing system under conditions which initiate the free radical polymerization process to cure the deposited film;
(c) expose, in-situ, the cured film to light generated by a second source of light of the direct-to-object printing system under conditions which induce light absorption by unreacted photoinitiator in the cured film;
(d) measure the absorbance of the cured film; and
(e) determine a degree of cure in the cured film from the measured absorbance and predetermined calibration data.

8. The controller of claim 7, the computer-readable medium further having computer-readable instructions stored thereon that, when executed by the processor, cause the controller to calculate the degree of cure using the measured absorbance and an equation fit to the predetermined calibration data.

9. The controller of claim 8, the computer-readable medium further having computer-readable instructions stored thereon that, when executed by the processor, cause the controller to compare the calculated degree of cure to a predetermined target degree of cure and to carry out step (b) an additional time if the calculated degree of cure is outside a predetermined threshold value.

10. The controller of claim 8, wherein the predetermined calibration data comprises a set of predetermined absorbance values and associated predetermined degree of cure values, the predetermined degree of cure values generated using solvent extraction.

11. A non-transitory computer-readable medium for a controller of a direct-to-object printing system, the non-transitory computer-readable medium having computer-readable instructions stored thereon that, when executed by a controller, cause a direct-to-object printing system operatively coupled to the controller to
(a) deposit an ink composition on a surface of an object to form a film thereon, the ink composition comprising a photoinitiator capable of initiating a free radical polymerization process in the ink composition upon the absorption of light to cure the deposited film;
(b) expose, in-situ, the deposited film to light generated by a first source of light of the direct-to-object printing system under conditions which initiate the free radical polymerization process to cure the deposited film;
(c) expose, in-situ, the cured film to light generated by a second source of light of the direct-to-object printing system under conditions which induce light absorption by unreacted photoinitiator in the cured film;
(d) measure the absorbance of the cured film; and
(e) determine a degree of cure in the cured film from the measured absorbance and predetermined calibration data.

12. The non-transitory computer-readable medium of claim 11, the computer-readable medium further having computer-readable instructions stored thereon that, when executed by the processor, cause the controller to calculate the degree of cure using the measured absorbance and an equation fit to the predetermined calibration data.

13. The non-transitory computer-readable medium of claim 12, the computer-readable medium further having computer-readable instructions stored thereon that, when executed by the processor, cause the controller to compare the calculated degree of cure to a predetermined target degree of cure and to carry out step (b) an additional time if the calculated degree of cure is outside a predetermined threshold value.

14. The non-transitory computer-readable medium of claim 12, wherein the predetermined calibration data comprises a set of predetermined absorbance values and associated predetermined degree of cure values, the predetermined degree of cure values generated using solvent extraction.

* * * * *